(12) United States Patent
Furukawa et al.

(10) Patent No.: US 6,687,868 B1
(45) Date of Patent: Feb. 3, 2004

(54) TEST DEVICE AND METHOD FOR ELECTRICALLY TESTING ELECTRONIC DEVICE

(75) Inventors: Yasuo Furukawa, Tokyo (JP); Koji Asami, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/543,416

(22) Filed: Apr. 5, 2000

(30) Foreign Application Priority Data

| Apr. 6, 1999 | (JP) | ............................................. | 11-099276 |
| Oct. 12, 1999 | (JP) | ............................................. | 11-290042 |

(51) Int. Cl.$^7$ ............................................. G01R 31/28
(52) U.S. Cl. .................................... 714/740; 324/158.1
(58) Field of Search ............................... 714/724, 738; 324/73.1, 158.1

(56) References Cited

U.S. PATENT DOCUMENTS

| 5,461,310 | A |   | 10/1995 | Cheung et al. | ........... 324/158.1 |
| 5,646,521 | A | * | 7/1997  | Rosenthal et al. | ........ 324/158.1 |
| 5,909,186 | A | * | 6/1999  | Gohringer | .................... 341/120 |
| 6,058,502 | A | * | 5/2000  | Sakaguchi | ................... 714/811 |
| 6,175,939 | B1 | * | 1/2001 | Dinteman | .................... 714/724 |

FOREIGN PATENT DOCUMENTS

| EP | 0 984 291 A1 | 3/2000 | ....... G01R/31/3183 |
| JP | 64-075978    | 3/1989 | ........... G01R/31/28 |
| JP | 6-18625      | 1/1994 | ........... G01R/31/28 |

OTHER PUBLICATIONS

Abstract of Japanese Patent Application No. 6–18625 dated Jan. 28, 1994.
Abstract of Japanese Patent Application No. 64–075978 dated Mar. 22, 1989.
Korean Office Action dated Jun. 24, 2003, English translation, 1 page.
B. Dufort et al., "Signal Generation Using Periodic Single and Multi–Bit Stigma–Delta Modulated Streams", Test Conference, 1997. Proceedings, International.
German Office Action dated Dec. 20, 2002, 6 pages, with English translation, 7 pages.

\* cited by examiner

Primary Examiner—Albert Decady
Assistant Examiner—Matthew C. Dooley
(74) Attorney, Agent, or Firm—Rosenthal & Osha L.L.P.

(57) ABSTRACT

A test device for electrically testing an electronic device (DUT) 100 comprises a pattern memory 13A, a pattern generator 13, a first filter 20B, and a pin electronic assembly 19. The pattern memory 13A stores data defining test patterns to be supplied to the DUT 100. The pattern generator 13 generates a plurality of test patterns to be input to a plurality of input pins of the DUT using digital signals based on the data stored in the pattern memory 13A. The first filter converts at least one of the plurality of test patterns to analog signals. The pin electronic assembly 19 supplies the plurality of test patterns including the analog signal test pattern to the DUT 100.

26 Claims, 10 Drawing Sheets

US 6,687,868 B1

TEST DEVICE AND METHOD FOR ELECTRICALLY TESTING ELECTRONIC DEVICE

This patent application claims priority based on Japanese patent application, H11-99276 filed on Apr. 6, 1999 and H11-290042 filed on Oct. 12, 1999, the contents of which are incorporated herein by reference.

BACKGROUND OF THE INVENTION

1. Field of the Invention

The present invention relates to a test device and a method of testing an electronic device having a plurality of input pins, and more particularly to a test device and a method of testing an electronic device having an input pin to which analog signals are to be input.

2. Description of the Related Art

Conventionally, a test device for testing an electronic device such as an integrated circuit having analog circuits and digital circuits therein is known.

FIG. 1 shows a structure of a conventional test device. The test device comprises digital circuits and analog circuits. The test device is capable of testing an electronic device having a plurality of digital pins for inputting and outputting digital signals and a plurality of analog pins for inputting and outputting analog signals. The electronic device to be tested by the test device will be referred to as a DUT (a device under test) hereinafter.

The DUT 100 shown in FIG. 1 includes analog circuits such as a programmable gain amplitude (PGA), a low pass filter (LPF), an analog to digital converter (ADC) and a digital to analog converter (DAC). The DUT 100 shown in FIG. 1 also includes digital circuits such as logic circuits including a memory interface and a central processing unit (CPU), a plurality of analog pins APIN and a plurality of digital pins DPIN. The analog pins APIN are used for inputting and outputting analog signals to and from the analog circuits of the DUT 100. The digital pins DPIN are used for inputting and outputting digital signals to and from the digital circuits of the DUT 100.

The test device includes a clock generator 101, a pattern generator 103, a digital pin electronic assembly 105, a digital analog synchronous circuit 107, an arbitrary waveform generator (AWG) 109, an analog pin electronic assembly 111, and a digitizer 113. The clock generator 101 generates a predetermined clock signal. The pattern generator 103 generates a plurality of test patterns using digital signals based on the clock signal generated by the clock generator 101. The digital signals of the test patterns are supplied to the plurality of digital pins DPIN of the DUT 100.

The digital pin electronic assembly 105 supplies the digital signals of the test patterns generated by the pattern generator to predetermined input digital pins DPIN of the DUT 100. The digital pin electronic assembly 105 receives output signals from the predetermined output digital pins DPIN of the DUT 100. The digital analog synchronous circuit 107 synchronizes the pattern generator 103 and the AWG 109. The AWG 109 generates and outputs one kind of predetermined analog signal.

The analog pin electronic assembly 111 includes signal lines and a plurality of switches SW. The analog signal generated by the AWG 109 is input to a predetermined input analog pin APIN of the DUT 100 by commuting the switches SW. The analog signal output from a predetermined output analog pin APIN of the DUT 100 is input to the digitizer 113 by commuting the switches SW. The digitizer 113 measures and analyzes frequency characteristics and group delays based on the analog signal output from the DUT 100.

FIG. 2 shows a structure of the arbitrary waveform generator of the conventional test device. The arbitrary waveform generator 109 includes a central processing unit (CPU) 109A, a waveform memory 109B, a sequence control unit 109C, a full-scale digital analog converter (full-scale DAC) 109D, an off-set digital analog converter (off-set DAC) 109E, a digital analog converter (DAC) 109F, a low pass filter (LPF) 109G, an amplitude 109H, an attenuator (ATT) 109I, and a correction calculator 109J.

Operations executed by the arbitrary waveform generator 109 under the control of the CPU 109A will be described in the following. The sequence controller 109C sequentially reads out data from the waveform memory 109B based on the clock signal output from the clock generator 101 and the control of the digital analog synchronous circuit 107, to output to the DAC 109F. The DAC 109F converts data input from the waveform memory 109B to a predetermined data format to output to the LPF 109G, based on gain signals output from the full-scale DAC 109D and the clock signal output from the clock generator 101.

The LPF 109G filters the data input from the DAC 109F for output to the amplitude 109H. The amplitude 109H adds off-set values output from the off-set DAC 109E to the analog signal output from the LPF 109G to output to the ATT 109I. The ATT 109I adjusts to attenuate the voltage of the analog signal to within a predetermined range for output to the analog pin electronic assembly 111. The correction calculator 109J calculates the analog signal output from the ATT 109I. The result of the calculation by the correction calculator 109J is used for correcting the signal.

FIG. 3 shows a process of generating the analog signal using the conventional test device. Firstly, an analog signal having a desired waveform is selected for supply to the DUT 100 (S100) A sampling frequency fs for sampling the analog signal (S102) is determined. Generally, the sampling frequency fs is determined by dividing the period of the waveform of the analog signal by the memory lengths which the waveform memory 109B can store. The selected analog signal is generated, sampled in accordance with the determined sampling frequency fs, and stored in the waveform memory 109B (S104). The data stored in the waveform memory 109B is sequentially read out when the analog signal is to be generated. Then, the analog signal is output (S106).

It is necessary to supply a plurality of analog signals to the electronic device simultaneously, or to supply synchronized digital signals and analog signals to the electronic device, in order to test an electronic device having analog circuits and digital circuits therein as described above.

However, in the above described conventional test device, the test device needs to include a plurality, of arbitrary waveform generators to supply a plurality of analog signals to the electronic device at same time. This leads to a test device that is large and expensive. The test device needs to include the digital analog synchronous circuit to synchronize the analog signals and the digital signals. The digital analog synchronous circuit has a complicated structure that makes the test device expensive. There is another problem where even with this digital analog synchronous circuit, the digital signals and the analog signals cannot be precisely synchronized for supply to the electronic device. It is necessary for the test device to be able to easily adjust the timing of generation of the analog signals and the digital signals to be supplied to the electronic device.

SUMMARY OF THE INVENTION

Therefore, it is an object of the present invention to provide a testing technique that overcomes the above issues in the related art. This object is achieved by combinations described in the independent claims. The dependent claims define further advantageous and exemplary combinations of the present invention.

The test device according to the present invention is for electrically testing an electronic device having a plurality of input pins. An aspect of the present invention comprises a pattern generator generating a plurality of test patterns using digital signals based on data defining a plurality of test patterns including an analog signal test pattern and a digital signal test pattern to be supplied to said electronic device, said test patterns being input to said plurality of input pins of said electronic device and a first filter converting said digital signals of said analog signal test pattern to analog signals. Said plurality of test patterns including said analog signal test pattern are supplied to said electronic device.

The first filter converts said digital signals to said analog signals. Said digital signals are digital signals of said analog signal test pattern and a low pass filter or a band pass filter, as said first filter, converts said digital signals to said analog signals.

In this structure, the test pattern of the analog signal test pattern is generated as digital signals. Therefore, the test for analog signals and the test for digital signals can be synchronized when necessary. As the pattern generator generates the test pattern of the analog signals, there is no need to include, for example, an arbitrary waveform generator. For example, delta-sigma modulation is used for generating the analog signal test pattern as the digital signals.

The test device may further comprise a display unit displaying a chart in which both of said analog signal test pattern and said digital signal test pattern are shown in accordance with a time base. The test device may further comprise a time setting unit setting time for supply of said analog signal test pattern and said digital signal test pattern to said electronic device. The test device may comprise a second filter having a specific difference from said first filter and converting said digital signals of said test pattern generated by said test pattern generator to analog signals; and a filter switching unit selecting either of said analog signals of said test patterns converted by said first filter and said second filter to supply to said electronic device.

An aspect of method for electrically testing an electronic device having a plurality of input pins according to the present invention comprises generating a plurality of test patterns using digital signals, based on data defining said plurality of test patterns including an analog signal test pattern and a digital signal test pattern to be supplied to said electronic device, to be input to said plurality of input pins of said electronic device; converting said digital signals of said analog signal test pattern to analog signals; and supplying said plurality of test patterns including said analog signal test pattern to said electronic device.

Another aspect of method for electrically testing an electronic device having a plurality of input pins according to the present invention comprises first to third steps. The first step generates digital data based on a single timing signal, said digital data including first digital data for analog signals for testing said analog circuit and second digital data for digital signals for testing said digital circuit. The second step converts said first digital data for analog signals for testing said analog circuit to analog signals. The third step supplies said second digital data for digital signals for testing said digital circuit to said digital circuit of said electronic device and said analog signals to said analog circuit of said electronic device.

Said first step may generate said first digital data for analog signals for testing said analog circuit as a part of said digital data using delta-sigma modulation. Said second step may convert said first digital data to said analog signals using band pass filtration or low pass filtration.

This summary of the invention does not necessarily describe all essential features. The invention may also be a sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
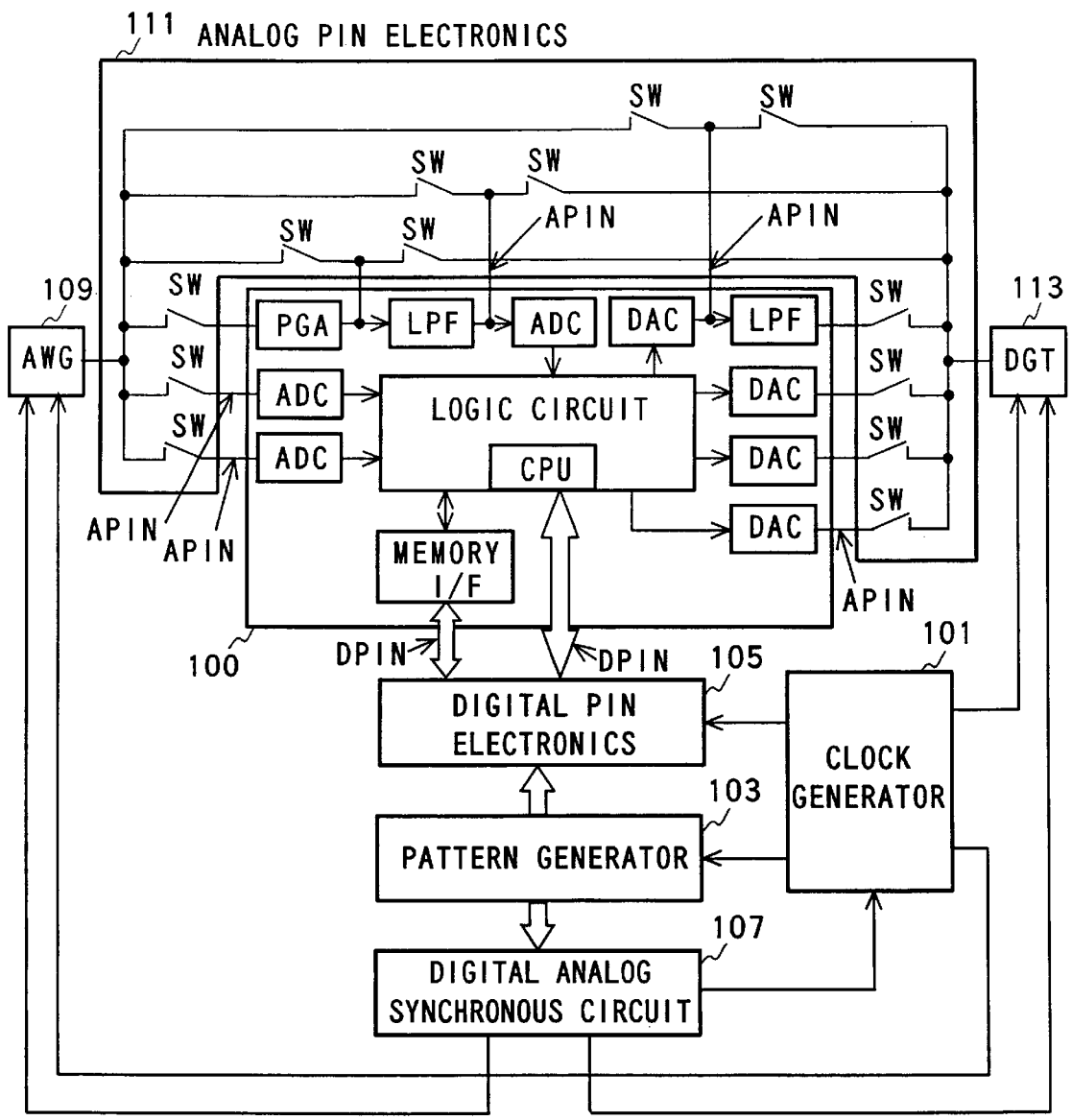
FIG. 1 shows a structure of the conventional test device.
Figure 2:
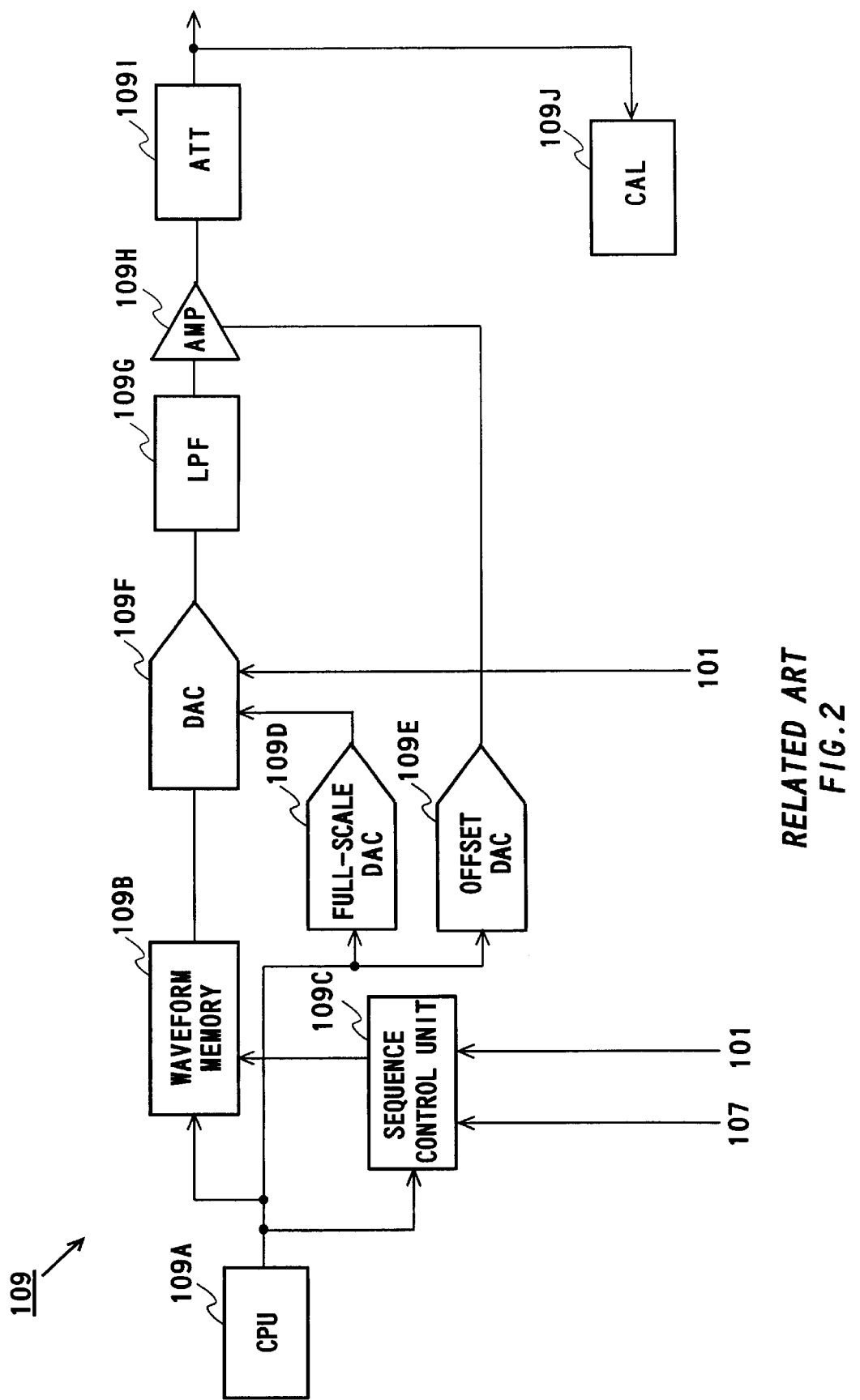
FIG. 2 shows a structure of the conventional arbitrary waveform generator.
Figure 3:
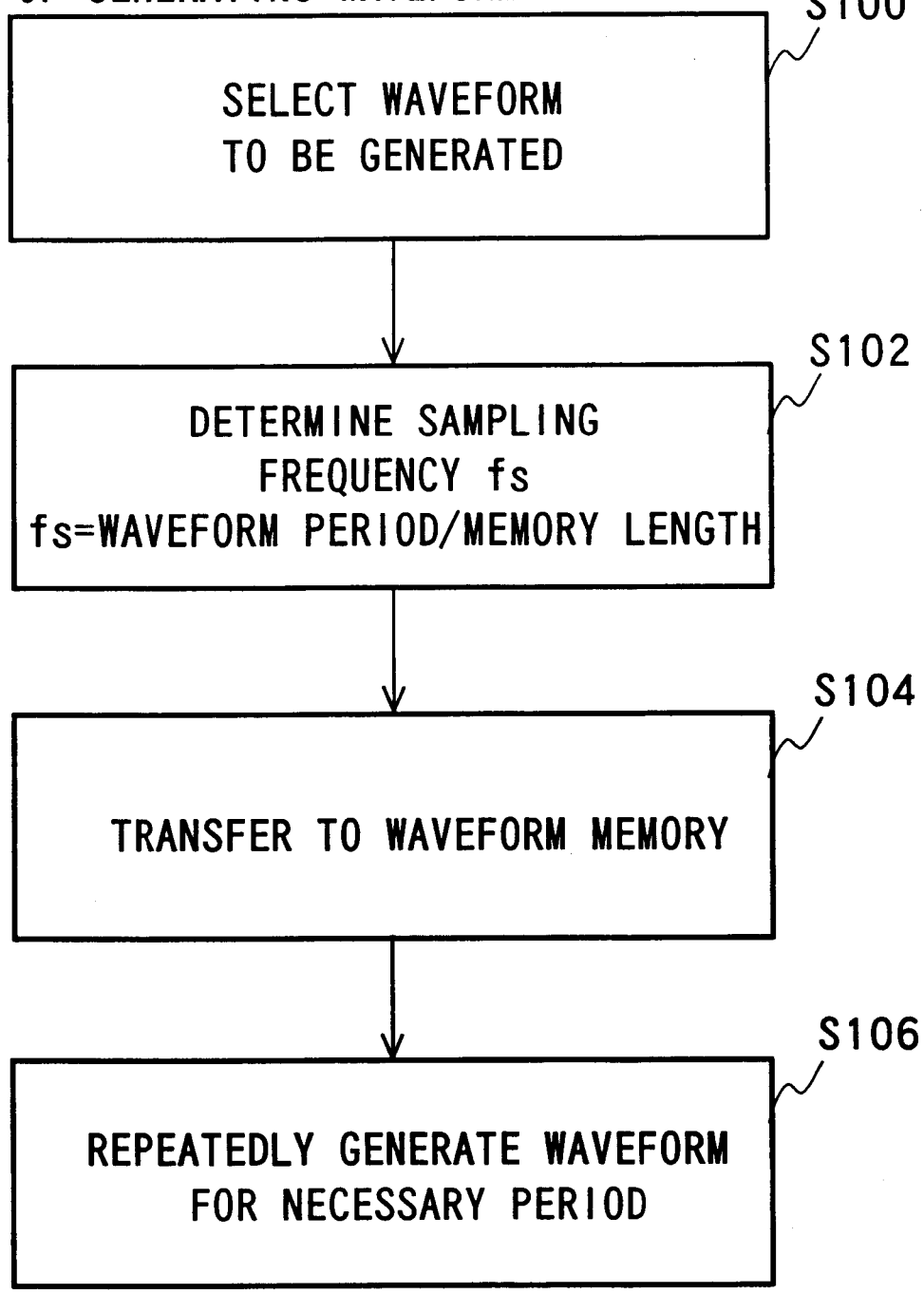
FIG. 3 shows a process of generating an analog signal using the conventional test device.
Figure 4:
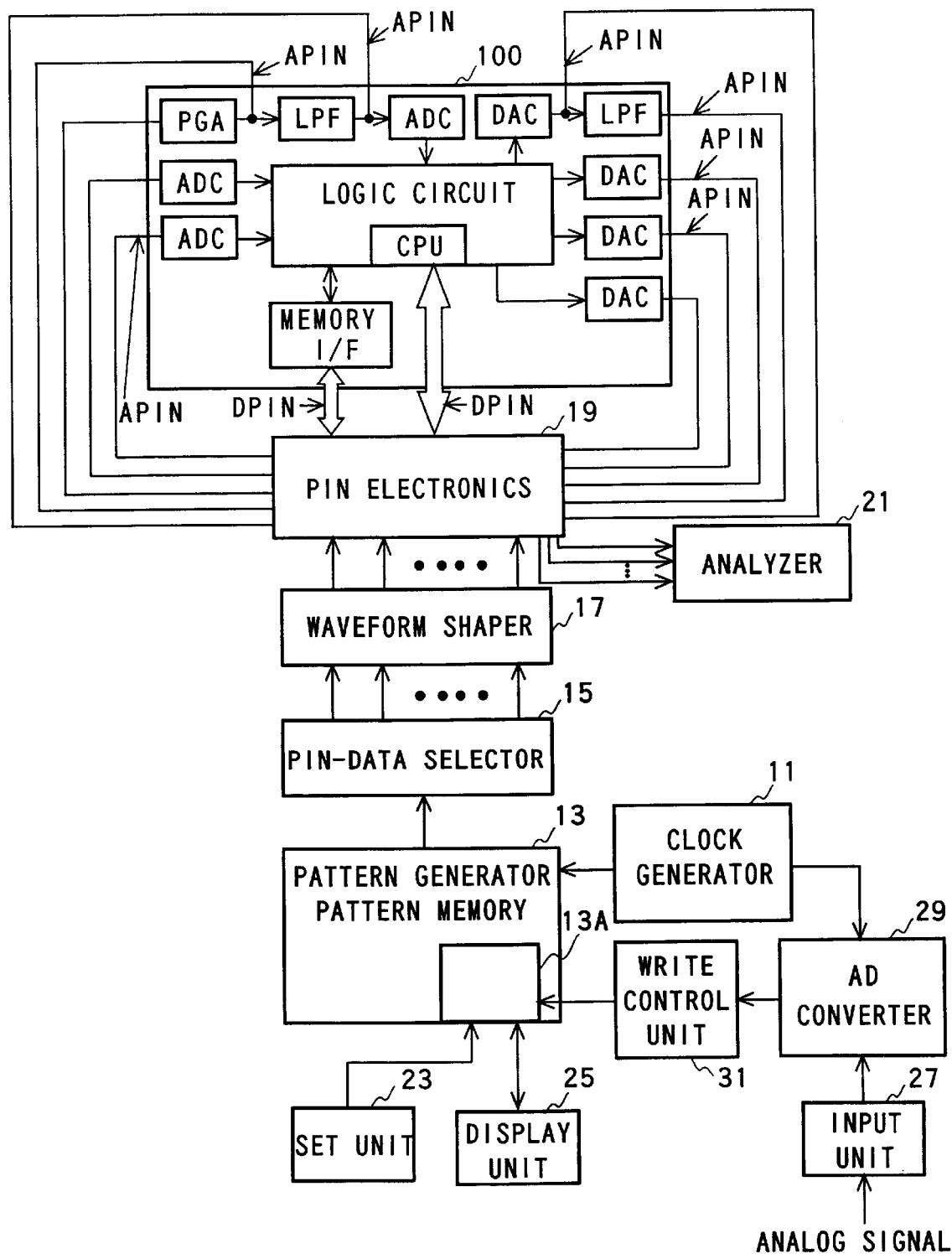
FIG. 4 shows a structure of the test device of the first embodiment according to the present invention.

FIG. 4 shows a test device according to the first embodiment of the present invention. The test device shown in FIG. 4 is for electrically testing an electronic device comprising a plurality of digital pins for inputting and outputting digital signals and a plurality of analog pins for inputting and outputting analog signals. The electronic device to be tested by the test device will be referred to as a DUT (a device under test) hereinafter.

The test device includes a clock generator 11, a pattern generator 13, pin-data selector 15, a waveform shaper 17, a pin electronic assembly 19, an analyzer 21, a set unit 23 which is an example of a supply time set unit, a display unit 25, an input unit 27, an analog to digital converter (AD converter) 29, and a write control unit 31.

The clock generator 11 generates a clock signal for controlling the timing of the test device. The clock generator 11 also generates subharmonics of the clock signal. The subharmonics of the clock signal have a frequency which is m/n (m>0 and n>1, both m and n are integer) of that of the clock signal. The subharmonics of the clock signal can be obtained from a flip-flop circuit or a shift resister in combination thereof with a logic gate, or a phase locked loop. The original clock signal and the subharmonics of the clock signal are referred to as a "standard clock signal". This means that the word "standard clock signal" is used for both the original clock signal and the subharmonics thereof except when referred otherwise.

The pattern generator 13 includes a pattern memory 13A. The pattern memory 13A stores data defining test patterns for analog signals to be supplied to the input analog pins APIN of the DUT 100 and data defining test patterns for digital signals supplied to the input digital pins DPIN of the DUT 100. The test patterns for analog signals are referred to as "analog signal test patterns" and the test patterns for digital signals are referred to as "digital signal test patterns".

The pattern generator 13 generates the plurality of test patterns stored in the pattern memory 13A based on the standard clock signal. The pattern generator 13 may start generating the test patterns with the standard clock signal itself, or start generating the test patterns at a delayed time which delays generation by a predetermined period from the clock signal.

In this embodiment, data defining an analog signal test pattern is stored as a bit array in the pattern memory 13A. The bit array is obtained from a digital conversion including delta-sigma modulation of the analog signal test pattern. Each of the bits in the bit array corresponds to an address of the memory. The standard clock signal is used as a sampling clock in the digital conversion to obtain the bit array. Therefore, the data of the analog signal test pattern obtained by the sampling can easily be synchronized with the data of the digital signal test pattern.

In this embodiment, the pattern generator 13 outputs the test patterns in NRZ (non-return to zero) format. This means that the pattern generator 13 continuously outputs a logic value "1" when the data of the pattern memory 13A has a logic value "1". The pattern generator 13, on the other hand, continuously outputs a logic value "0" when the data of the pattern memory 13A has a logic value "0". The delta-sigma modulation also includes a modulation called a sigma-delta modulation.

The pattern generator 13 generates each of the test patterns based on the time set by the set unit 23. In this embodiment, the pattern generator 13 calculates a time lag between the first time when a test pattern is generated and the second time when another test pattern is generated. The pattern generator 13 then generates each of the test patterns based on the time lag.

The pin-data selector 15 distributes the plurality of test patterns output from the pattern generator 13 to be adapted to each of the input pins of the DUT 100 and outputs the test patterns to the waveform shaper 17. The waveform shaper 17 shapes each of the test patterns distributed by the pin-data selector 15 and outputs the test patterns to the pin electronic assembly 19.

The pin electronic assembly 19 supplies each of the test patterns output from the waveform shaper 17 to predetermined input pins of the DUT 100. The pin electronic assembly 19 converts the test patterns which are to be supplied to the analog input pins of the DUT 100 to analog signals and supplies the converted test patterns to the DUT 100. The pin electronic assembly 19 receives output signals from the output pins of the DUT 100 and outputs the output signals to the analyzer 21.

Figure 5:
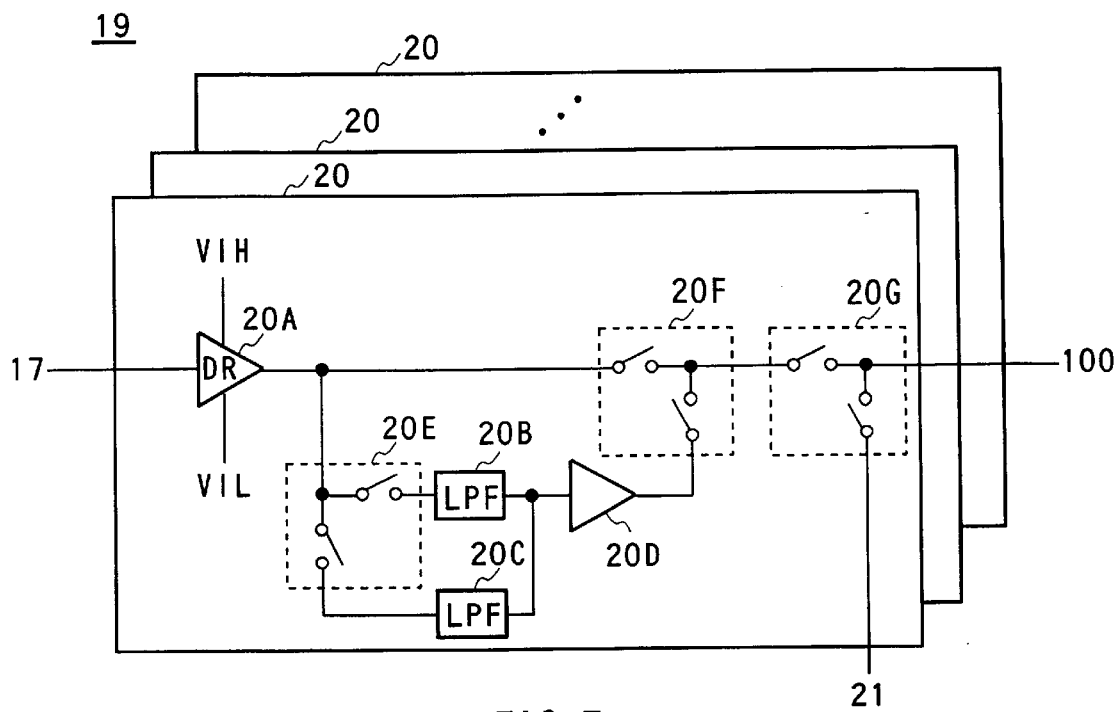
FIG. 5 shows a first example of a structure of the pin electronic assembly of the first embodiment according to the present invention.

FIG. 5 shows a first example of a structure of the pin electronic assembly of the first embodiment of the invention. The pin electronic assembly 19 includes a plurality of pin electronic assembly 20 each respectively corresponding to each of the pins of the DUT 100. Each pin electronic assembly 20 has a driver 20A, a first low pass filter (LPF) 20B, a second low pass filter (LPF) 20, a buffer 20D, a filter switching unit 20E, an analog-digital switching unit 20F, and an input-output switching unit 20G.

The driver 20A is operated between high voltage VIH and low voltage VIL. The driver 20A outputs a high voltage VIH when the test pattern input from the waveform shaper 17 has a logic value "1", and outputs a low voltage VIL when the test pattern input from the waveform shaper 17 has a logic value "0". The first LPF 20B only passes signals having a frequency at a predetermined cut-off frequency or lower than the predetermined cut-off frequency. The first LPF 20B converts input digital signals to analog signals. The first LPF 20B of this embodiment is for sound signals whose predetermined cut-off frequency is 20 KHz. The second LPF 20C has a specific difference from the first LPF 20B. The second LPF 20C only passes signals having a frequency at a predetermined cut-off frequency or lower than the predetermined cut-off frequency. The second LPF 20C converts input digital signals to analog signals. The second LPF 20C of this embodiment is for picture signals whose predetermined cut-off frequency is 6 MHz. The buffer 20D prevents any bad effects from the electrical interaction generated between the circuits by having the buffer 20D therebetween.

The filter switching unit 20E selects either the first LPF 20B or the second LPF 20C to which the signal output from the driver 20A is lead. In this embodiment, when the pin of the DUT 100 corresponding to the pin electronic assembly 20 comprising this filter switching unit 20E is a sound signal input analog pin APIN, the filter switching unit 20E selects to have the signal pass through the first LPF 20B. When, on the other hand, the pin of the DUT 100 corresponding to the pin. electronic assembly comprising this filter switching unit 20E is a picture signal input analog pin APIN, the filter switching unit 20E selects to have the signal pass through the second LPF 20C.

The analog-digital switching unit 20F selects either the analog signal or the digital signal to be supplied to the DUT 100. In this embodiment, when the pin of the DUT 100 corresponding to the pin electronic assembly 20 comprising this analog-digital switching unit 20F is an input digital pin DPIN, the analog-digital switching unit 20F selects output from the driver 20A to be connected to the input-output switching unit 20G so that the digital signal passes therethrough. When, on the other hand, the pin of the DUT 100 corresponding to the pin electronic assembly 20 comprising this analog-digital switching unit 20F is an input analog pin APIN, the analog-digital switching unit 20F selects output from the buffer 20D to be connected to the input-output switching unit 20G so that the analog signal passes therethrough.

The input-output switching unit 20G selects whether to output the signal from the analog-digital switching unit 20F to the pin of the DUT 100 or to input the signal from the pin of the DUT 100. In this embodiment, when the pin of the DUT 100 corresponding to the pin electronic assembly 20 comprising this input-output switching unit 20G is an input pin, the input-output switching unit 20G connects the analog-digital switching unit 20F and the DUT 100 so that the test pattern is input to the DUT 100. When, on the other hand, the pin of the DUT corresponding to the pin electronic assembly 20 comprising this input-output switching unit 20G is an output pin, the input-output switching unit 20G connects the DUT 100 and the analyzer 21 so that the output signal from the DUT 100 is input to the analyzer 21. When the pin of the DUT 100 corresponding to the pin electronic assembly 20 comprising this input-output switching unit 20G is an input-output pin, the input-output switching unit 20G connects the analog-digital switching unit 20F and the DUT 100, and the DUT 100 and the analyzer 21. In this case, the test pattern is input to the DUT 100 and the output signal from the DUT 100 is input to the analyzer 21.

Referring back to FIG. 4, the analyzer 21 analyses each operation based on the output signals output from the DUT 100 via the pin electronic assembly 19. The analyzer 21 detects frequency characteristics or group delays when the output signal is an analog signal and analyses the characteristics of the DUT 100 based on the detection.

The display unit 25 displays charts showing each of the test patterns based on the data defining the plurality of test patterns stored in the pattern memory 13A. In this embodiment, the display unit 25 displays a chart in which a plurality of test patterns are shown in accordance with the same time base.

Figure 6:
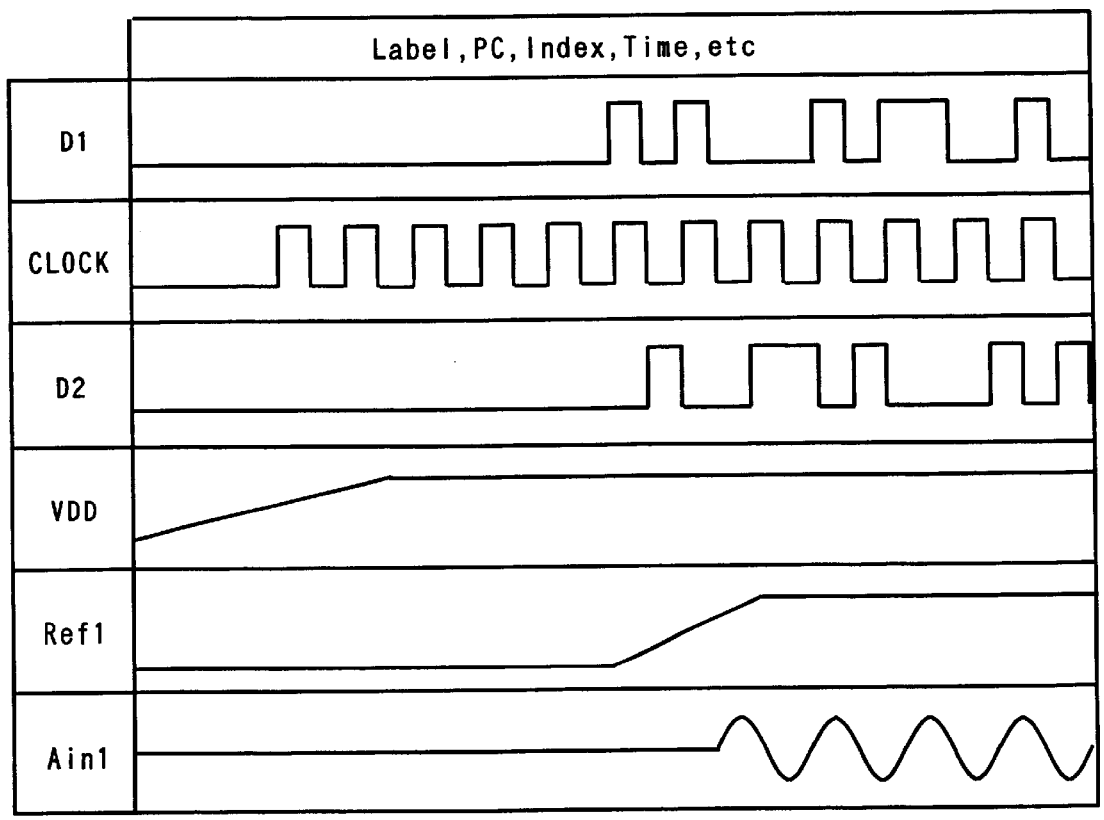
FIG. 6 illustrates a display shown on the display unit of the test device of the first embodiment according to the present invention.

FIG. 6 shows an example of the display shown on the display unit of the test device of the first embodiment according to the present invention. The display unit shows charts of digital signal test patterns designed to be input to the digital pins DPIN of the DUT 100 including "D1", "CLOCK", and "D2", and analog signal test patterns designed to be input to the analog pins APIN of the DUT 100 including "VDD", "Ref1" and "Ain", such that these test patterns have the same time base. The set unit 23 receives the time at which the plurality of test patterns are to be supplied to the DUT 100. In this embodiment, the set unit 23 receives the time from the user via an input device such as a mouse or a keyboard, not shown in the drawings. For example, when one of the test patterns in the chart shown in FIG. 6 is dragged by the mouse and transversely moved, the time at which the test pattern is to be generated is altered in accordance with the distance which the test pattern is moved.

The input unit 27 receives analog signals of the test patterns to be supplied to the DUT 100. The AD converter 29 converts the analog signals of the test patterns input from the input unit 27 to digital signals. The write control unit 31 writes the bit array of the digital signals of the test patterns converted by the AD converter 29 on the pattern memory 13A.

Figure 7:
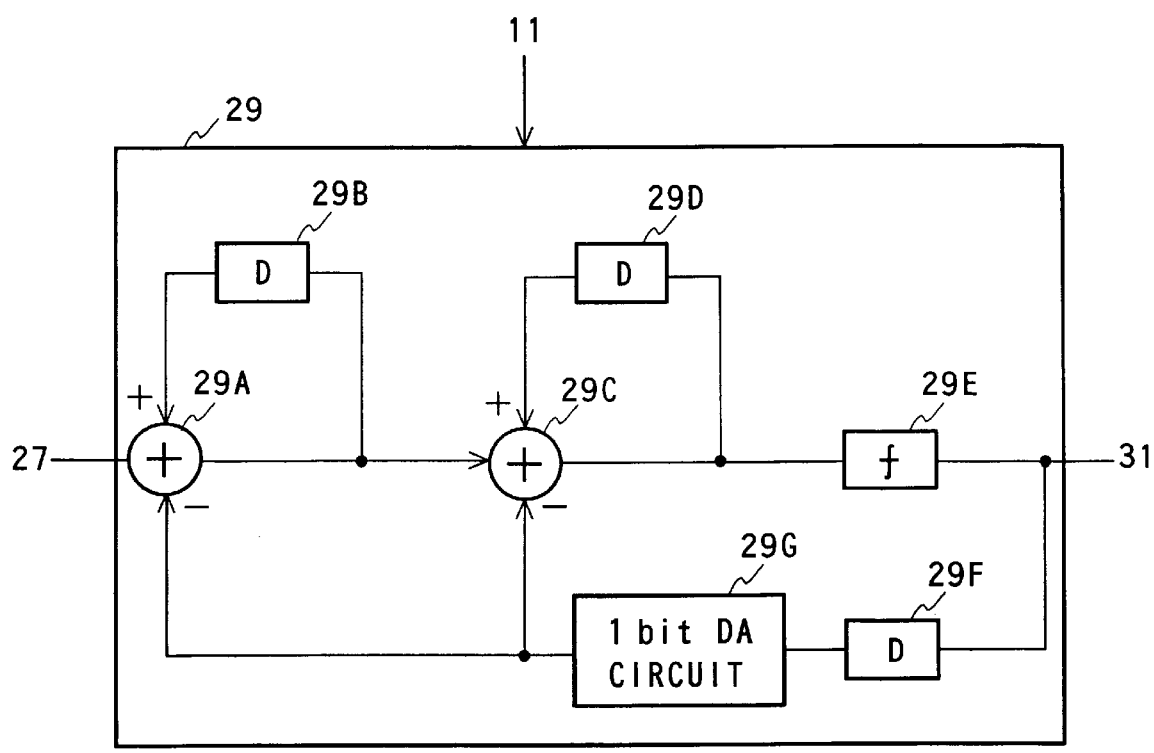
FIG. 7 shows an example of structure of the analog to digital converter of the first embodiment according to the present invention.

FIG. 7 shows an example of a structure of the AD converter of the first embodiment according to the present invention. The AD converter 29 conducts secondary delta-sigma modulation. The AD converter 29 includes a first adder 29A, a second adder 29C, a first delay element 29B, a second delay element 29D, a third delay element 29F, a comparator 29E, and a one-bit DA circuit 29G. The first delay element 29B delays a signal output from the first adder 29A and inputs the delayed signal to the first adder 29A. The second delay element 29D delays the signal output from the second adder 29C and inputs the delayed signal to the second adder 29C. The third delay element 29F delays the signal output from the comparator 29E and inputs the delayed signal to the one-bit DA circuit 29G. The one-bit DA circuit 29G converts the signal input from the third delay element 29F to an analog signal and inputs the analog signal to the first adder 29A and the second adder 29c. The first adder 29A adds the signal output from the first delay element 29B to the analog signal input from the input unit 27 and decreases the signal output from the one-bit DA circuit 29G from the analog signal input from the input unit 27. The second adder 29C adds the signal output from the second delay element 29D to the signal input from the first adder 29A and decreases the signal output from the one-bit DA circuit 29G from the signal input from the first adder 29A.

The comparator 29E compares the signal synchronized by the standard clock signal and output from the second adder 29C with a standard value. The comparator 29E outputs the result to the write control unit 31. In order to actualize over-samplings, the frequency of the standard clock signal is set at 64 times that of the sound analog signal when the signal input from the input unit 27 is the sound analog signal. Similarly, the frequency of the standard clock signal is set at 32 to 64 times that of the picture analog signal when the signal input from the input unit 27 is the picture analog signal.

Figure 8:
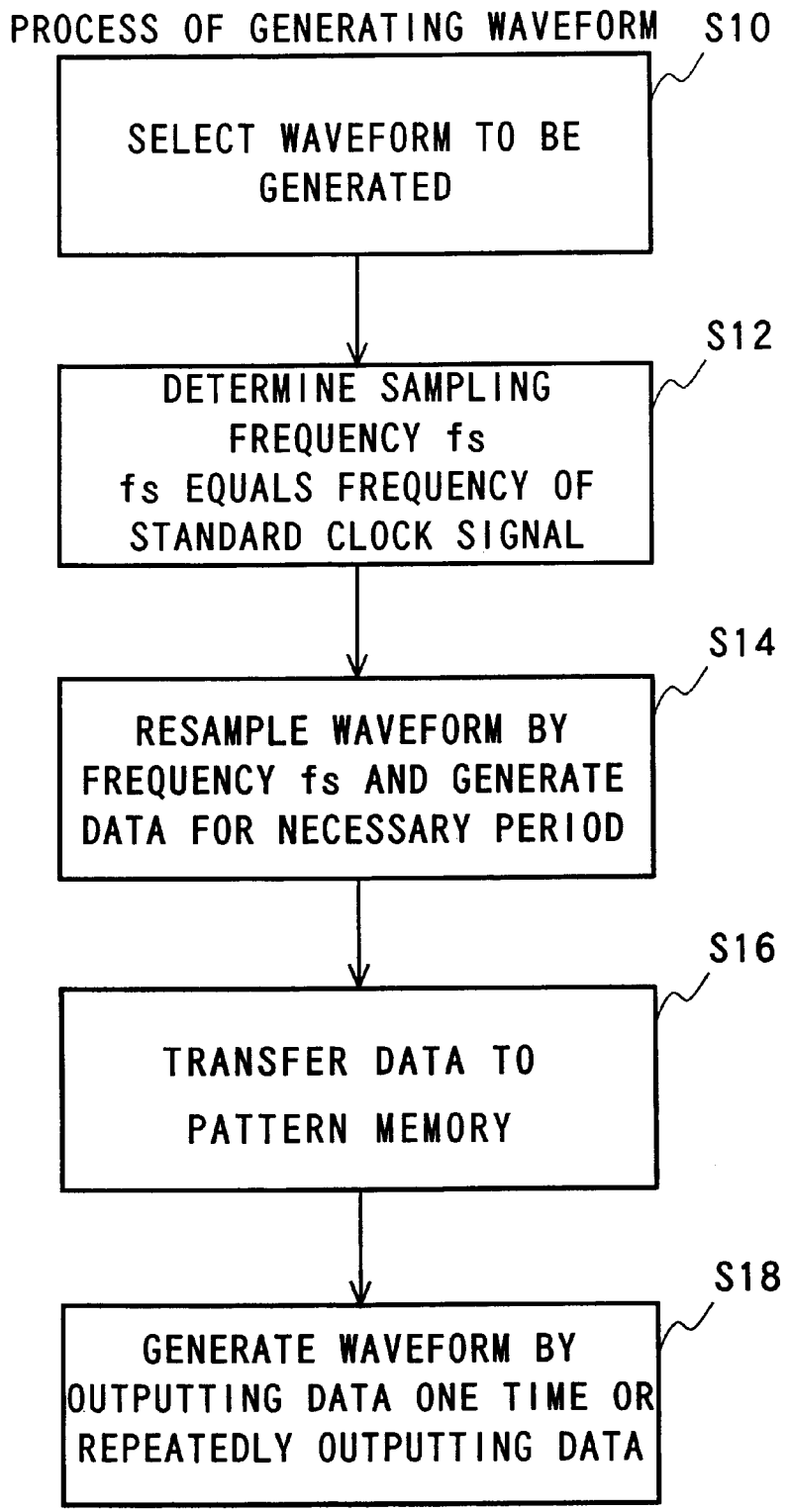
FIG. 8 shows a process of generating analog signals using the test device of the first embodiment according to the present invention.

FIG. 8 shows a process of generating an analog signal using the test device of the first embodiment according to the present invention. Firstly, an analog signal having a desired waveform is selected for supply to the DUT 100 (S10). A sampling frequency fs for sampling the analog signal (S12) is determined. The sampling frequency fs is the frequency of the standard clock signal. The selected analog signal is generated by an arbitrary waveform generator, not shown in the drawings, and input to the input unit 27 of the test device. The analog signal is input to the AD converter 29 from the input unit 27. The AD converter 29 samples the analog signal in accordance with the sampling frequency fs of the standard clock signal supplied from the clock generator 11 in order to convert the analog signal to digital data. The write control unit 31 writes the digital data on the pattern memory 13A. A unit of the analog signal to be supplied to the DUT 100, for example, analog signals corresponding to the whole of the test pattern or analog signals corresponding to a time cycle of the test pattern, are stored in the pattern memory 13A (S14 and S16). When there are a plurality of analog signal test patterns to be supplied to the DUT 100, the above operations are undertaken for each of the test patterns.

The pattern generator 13 reads out the data defining the plurality of test patterns based on the standard clock signal. The read out data is output to the pin electronic assembly 19 through the pin-data selector 15 and the waveform shaper 17. The pin electronic assembly 19 converts the test patterns to be supplied as analog signals to analog signals and outputs the analog signals to the input analog pins APIN of the DUT 100. The pin electronic assembly 19 also outputs the digital signals of the test patterns to be supplied as digital signals to the input digital pins DPIN of the DUT 100. When the pattern memory 13A stores the data of the analog signals corresponding to a time cycle of the test pattern, the pattern generator 13 repeatedly outputs the data stored in the pattern memory 13A. When the pattern memory stores the data of the analog signals corresponding to the whole of the test pattern, the pattern generator 13 outputs the data stored in the pattern memory 13A once only (S18).

Figure 9:
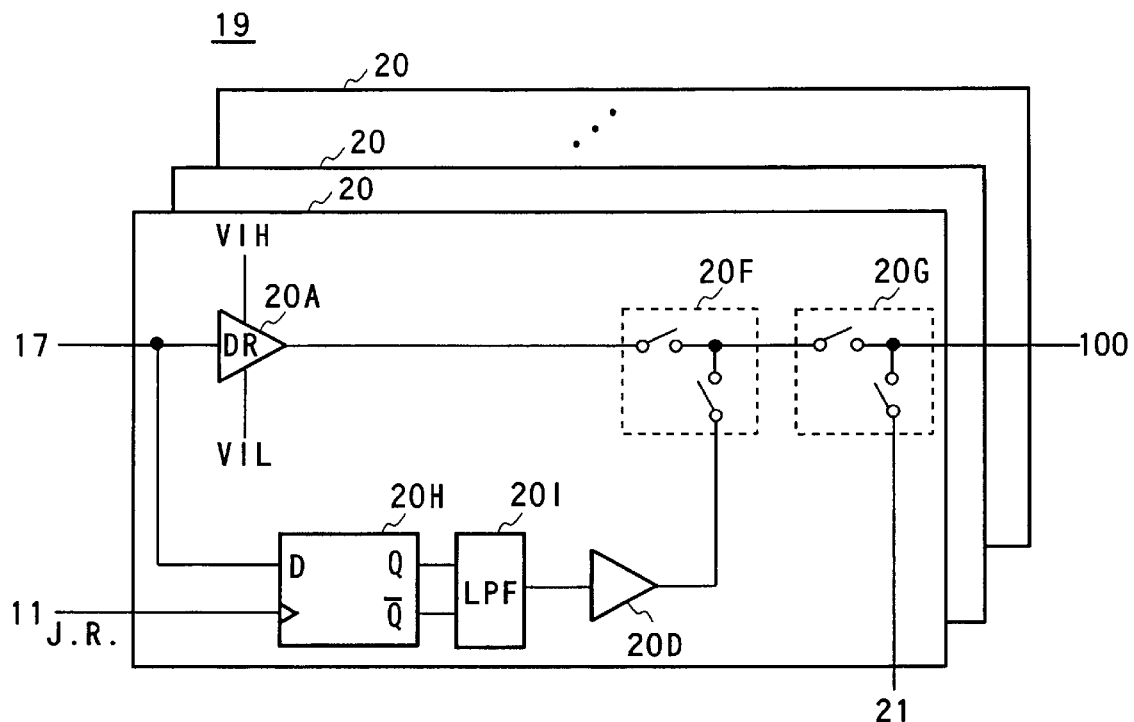
FIG. 9 shows a second example of a structure of the pin electronic assembly of the first embodiment according to the present invention.

FIG. 9 shows a second example of a structure of the pin electronic assembly of the first embodiment of the invention. The components which are same as those shown in FIG. 5 have the same symbols, and the explanation of those will be omitted. The pin electronic assembly 19 includes a plurality of pin electronic assembly 20 each respectively corresponding to each of the pins of the DUT 100. The pin electronic assembly 20 includes a driver 20A, a buffer 20D, an analog-digital switching unit 20F, an input-output switching unit 20G, a latch circuit 20H, and a LPF 20I.

The latch circuit in this example is a flip-flop circuit. The flip-flop circuit 20H has a D-pin, a clock pin, a Q-pin and a /Q-pin. The test pattern output from the waveform shaper 17 is input to the D-pin of the flip-flop circuit 20H. The jitter reducing signal (jitter reducer) output from the clock generator 11 is input to the clock pin of the flip-flop circuit 20H. The jitter reducing signal has the same frequency as that of a sampling signal of the data defining the analog signal stored in the pattern memory 13A. The standard clock signal or a signal having a predetermined delayed period relative to the standard clock signal is used as the jitter reducing signal. Generally, the rate of the jitter depends on the timing in the clock cycle, therefore, the test pattern is latched at a time when the rate of jitter is small.

The flip-flop circuit 20H latches the test-pattern and outputs the test pattern and the reversed test pattern at the same time with the every upward shift of the jitter reducing signal. This means that the flip-flop circuit 20H outputs the test pattern from the Q-pin and outputs the reversed test pattern from the /Q-pin based on the jitter reducing signal input from the clock pin. By this operation, jitters generated in the input test pattern can be reduced. The LPF 20I inputs the test pattern and the reversed test pattern output from the flip-flop circuit 20H. The LPF 20I converts the test pattern to analog signals based on the input test pattern and the reversed test pattern.

Figure 10:
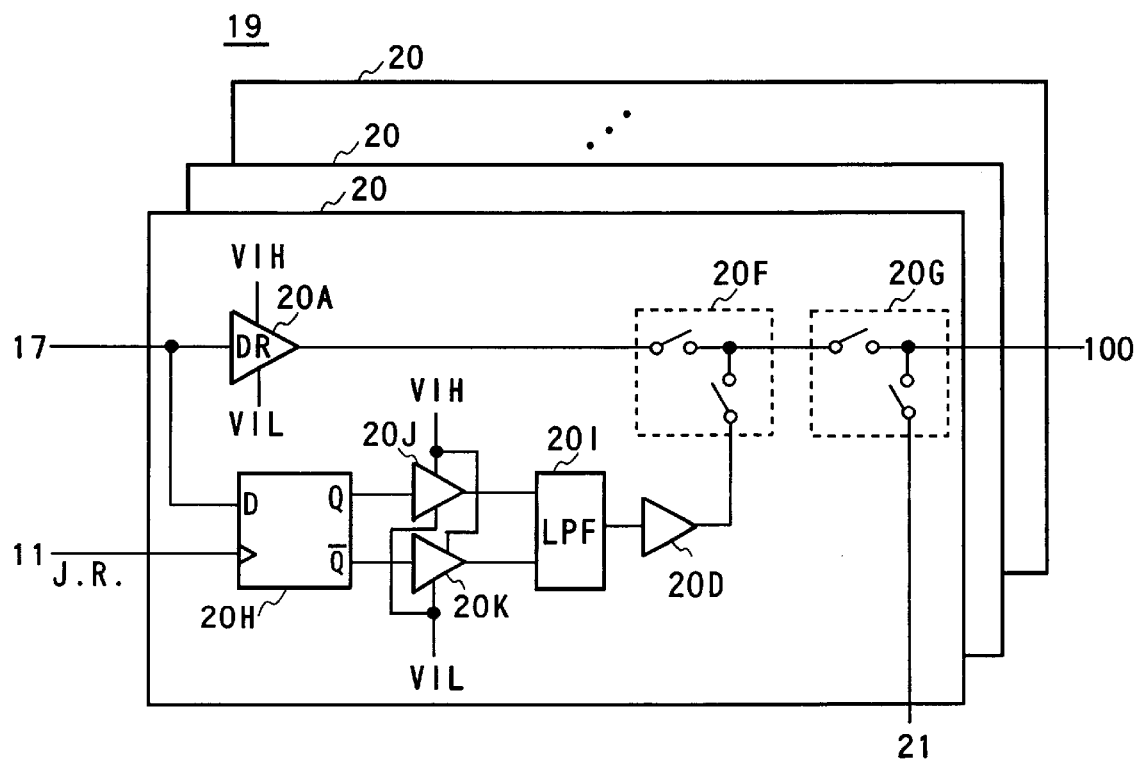
FIG. 10 shows a third example of a structure of the pin electronic assembly of the first embodiment according to the present invention.

FIG. 10 shows a third example of a structure of the pin electronic assembly of the first embodiment of the present invention. The pin electronic assembly 19 is similar to the second example of the pin electronic assembly 20 shown in FIG. 9 but further comprises amplifiers 20J and 20K. The amplifier 20J is interposed between the Q-pin of the flip-flop circuit 20H and one of the input pins of the LPF. The amplifier 20J amplifies the voltage level of the test pattern output from the Q-pin of the flip-flop circuit 20H. The test pattern is then input to the LPF 20I. The amplifier 20K is interposed between the /Q-pin of the flip-flop circuit 20H and the other of the input pins of the LPF 20I. The amplifier 20K amplifies the voltage level of the reversed test pattern output from the /Q-pin of the flip-flop circuit 20H. The reversed test pattern is then input to the LPF 20I. In this example of a pin electronic assembly 19, the voltage level of the analog signals can be amplified by amplifying the digital signals which are to be converted to the analog signals. Therefore, the structure can be simplified compared to an analog amplifier which directly amplifies the voltage level of analog signals.

Figure 11:
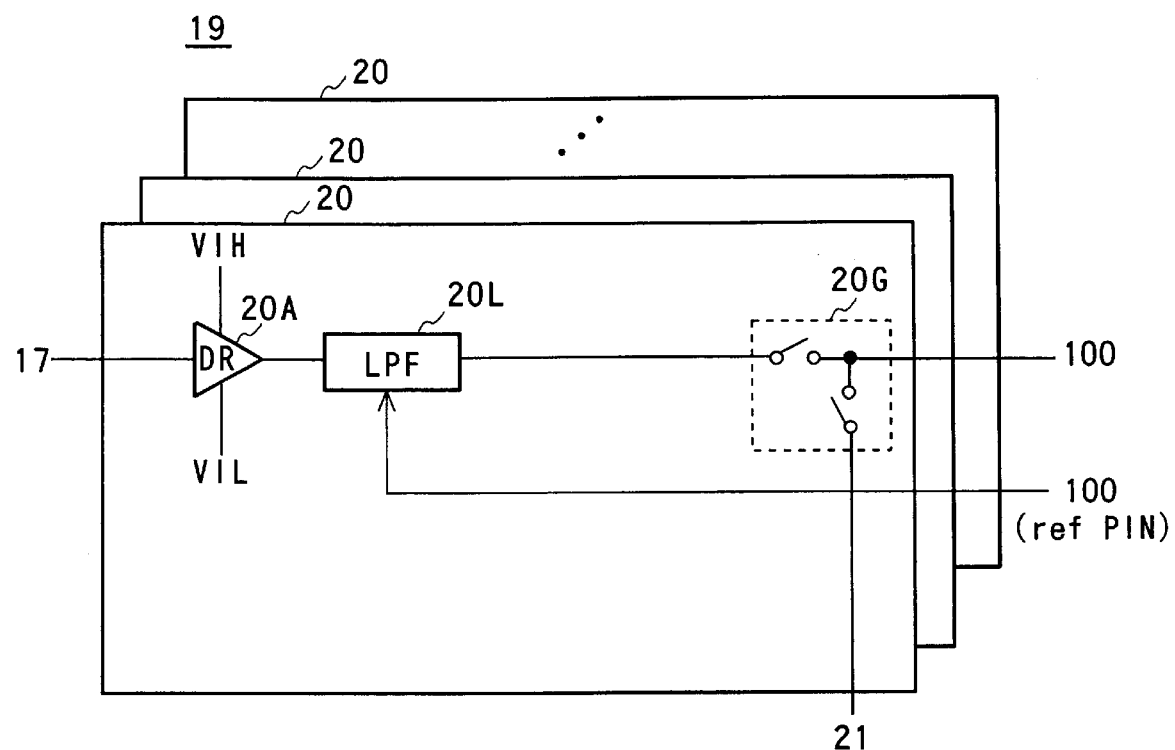
FIG. 11 shows a fourth example of a structure of the pin electronic assembly of the first embodiment according to the present invention.

FIG. 11 shows a fourth example of a structure of the pin electronic assembly of the first embodiment of the present invention. The DUT 100 includes a ref pin which outputs an off-set signal pointing off-set of the analog signals. The pin electronic assembly 20 of this pin electronic assembly 19 includes a driver 20A, a LPF 20L, and an input-output switching unit 20G. The LPF 20L converts the digital signals of the test pattern input from the driver 20A to analog signals by only passing signals having a frequency at a predetermined cut-off frequency or lower than the predetermined cut-off frequency. The LPF 20L outputs the converted analog signals after adding the off-set thereto based on the off-set signal input from the ref pin of the DUT 100, to a predetermined pin of the DUT 100.

Figure 12:
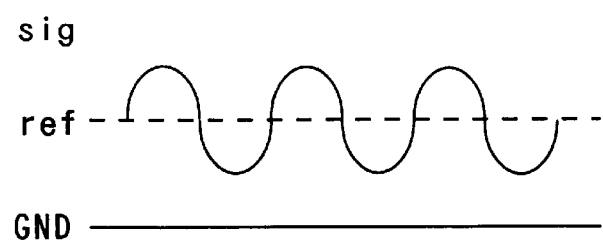
FIG. 12 shows an analog signal output by the pin electronic assembly of the first embodiment according to the present invention.

FIG. 12 shows an analog signal output by the pin electronic assembly of the first embodiment according to the present invention. FIG. 12 shows the test pattern output from the pin electronic assembly 19 shown in FIG. 11. As shown in FIG. 12, the test pattern to which the off-set (ref) is added is output from the pin electronic assembly 19 to the DUT 100. The pin electronic assembly 19 can supply an analog signal having an appropriate voltage level for the DUT 100.

Figure 13:
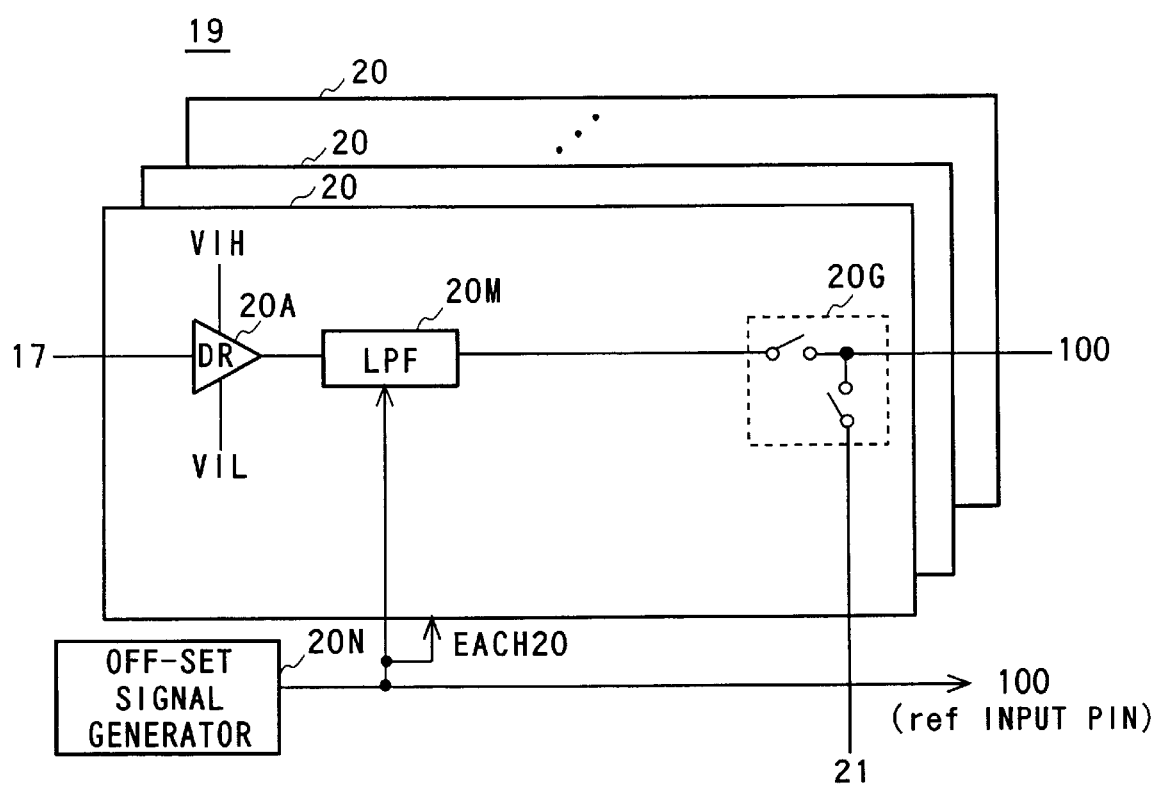
FIG. 13 shows a fifth example of a structure of the pin electronic assembly of the first embodiment according to the present invention.

FIG. 13 shows a fifth example of a structure of the pin electronic assembly of the first embodiment according to the present invention. The DUT 100 includes a ref pin to which a signal defining the standard voltage level is supplied. The pin electronic assembly 20 includes a driver 20A, a LPF 20M, an input-output switching unit 20G, and an off-set signal generator 20N.

The off-set signal generator 20N supplies the signal defining the standard voltage level of the DUT 100 to the ref pin of the DUT 100 and the LPF 20M. The LPF 20M converts the digital signals of the test patterns input from the driver 20A to analog signals, by only passing signals having a frequency at a predetermined cut-off frequency or lower than the predetermined cut-off frequency. The LPF 20M adds the off-set to the converted analog signals based on the signal input from the off-set signal generator 20N to output to a predetermined pin of the DUT 100.

The present invention is not limited to the above embodiments, and many changes can be made as will be explained in the following.

As for the first example, although the pin electronic assembly 19 comprises a plurality of pin electronic assembly 20 which are identical to each other in an above embodiment, the pin electronic assembly 19 may comprise at least one pin electronic assembly 20 described above.

As for the second example, although the pin electronic assembly 20 has a structure capable of selecting analog signals and digital signals to be output therefrom in an above embodiment, the pin electronic assembly 20 may have a structure which outputs either the analog signal test pattern or the digital signal test pattern.

As for the third example, the test device shown in FIG. 4 may have various structures. The test device can be constructed with only the pattern generator 13 and the pin electronic assembly 19. In addition, the test device may further comprise optional elements. For example, the analyzer 21 can be constructed as a part of the test device or the analyzer 21 can be an external device. The analyzer 21 may comprise a CPU for controlling the whole detecting operation, a comparator for comparing the output signal from the DUT 100 and the expected value of the output signal, and a memory for storing the compared result.

As for the fourth example, the test device shown in FIG. 4 may further comprise a device mounter on which the DUT 100 is mounted. A unit including the device-mounter may be a part of the test device or the unit may be separate from the test device. As for the latter case, the test device and the unit including the device mounter may be constructed as a test system.

As for the fifth example, the pin electronic assembly 19 shown in FIG. 5 may have various structures. The pin electronic assembly 19 may not include the driver 20A in some cases. The pin electronic assembly 19 may comprise 3 or more LPF's. Band pass filters can be used instead of the low pass filters LPF. The filter switching unit 20E, the analog-digital switching unit 20F, and the input-output switching unit 20G can be constructed as typical mechanical switches such as a dip switch, a rotary switch and the like, or electrical switches such as a tristate buffer including a TTL and a MOS, MOS switch and the like.

As for the sixth example, each of the test patterns in the chart shown in FIG. 6, may have different time bases. This means that the time bases for each of the test patterns can scale up and scale down. As the source voltage varies relatively very slow compared with high speed logic signals, the display scale for the source voltage "VDD" may be set for an order of milliseconds. Then, the display scale for the clock signal "CLOCK" may be set for an order of nanoseconds.

Although the present invention has been described by way of exemplary embodiments, it should be understood that many changes and substitutions may be made by those skilled in the art without departing from the spirit and the scope of the present invention which is defined only by the appended claims.

According to the present invention, a plurality of analog signals can be supplied to an electronic device with ease and low cost. Analog signals and digital signals are precisely synchronized for supply to the electronic device.

What is claimed is:

1. A test device for electrically testing an electronic device having first and second input pins, comprising:
   a pattern generator generating first and second test patterns based on digital signals based on data defining a plurality of test patterns including an analog signal test pattern and a digital signal test pattern to be supplied to said electronic device; and
   a pin electronic assembly comprising a first pin electronic element connected to the first input pin of the electronic device and a second pin electronic element connected to the second input pin of the electronic device,
   each of said first pin electronic element and said second pin electronic pin element further comprising:
   a first filter converting said digital data for said analog signal test pattern to analog signals
   each of said pin electronic elements selectively outputting one of said analog signal test pattern converted by said first filter and said digital signal test pattern.

2. A test device as set forth in claim 1, further comprising a pattern memory storing said data defining said plurality of test patterns.

3. A test device as set forth in claim 2, wherein said data stored in said pattern memory includes data for supply of said analog signal test pattern as analog signals to said electronic device and supply of said digital signal test pattern as digital signals to said electronic device.

4. A test device as set forth in claim 3, further comprising a display unit displaying a chart in which both of said analog signal test pattern and said digital signal test pattern are shown in accordance with a time base.

5. A test device as set forth in claim 4, further comprising a time setting unit setting time for supply of said analog signal test pattern and said digital signal test pattern to said electronic device; wherein said test pattern generator generates said plurality of test patterns based on time set by said time setting unit.

6. A test device as set forth in claim 2, further comprising a clock generator generating a clock signal; wherein said pattern generator generates said plurality of test patterns based on said clock signal.

7. A test device as set forth in claim 6, wherein said pattern memory stores each of one bit of said data defining said analog signal test pattern to be supplied to said electronic device in each addresses thereof; and said pattern generator sequentially reads out said each of said addresses, based on said clock signal, to generate said test patterns.

8. A test device as set forth in claim 2, wherein said pattern memory stores a bit array obtained by digital conversion of said analog signal test pattern to be supplied to said electronic device, in accordance with a predetermined sampling clock.

9. A test device as set forth in claim 8, wherein said digital conversion includes delta-sigma modulation.

10. A test device as set forth in claim 8, wherein said sampling clock frequency of m/n (m>0, n>1, both m and n are integer) of that of said clock signal.

11. A test device as set forth in claim 8, further comprising:
    a jitter reducing signal generator generating jitter reducing signals having same frequency as that of said sampling clock; and
    a latch circuit outputting digital signals of at least one of said test patterns by synchronizing said jitter reducing signals;
    wherein said first filter converts said digital signals of said at least one of said test patterns output from said latch circuit to analog signals.

12. A test device as set forth in claim 11, wherein said latch circuit outputs digital signals and reversed digital signals of said at least one of said test patterns, based on said jitter reducing signals; and said first filter converts said digital signals of said at least one of said test patterns output form said latch circuit to analog signals based on said digital signals and said reversed digital signals of said at least one of said test patterns.

13. A test device as set forth in claim 11, further comprising a driver adjusting a voltage level of said digital signals of said at least one of said test patterns output from said latch circuit for output; wherein said first filter converts said digital signals of said at least one of said test patterns output from said driver to analog signal.

14. A test device as set forth in claim 1, further comprising a selecting circuit selecting either said digital signal test pattern generated by said test pattern generator or said analog signal test pattern converted by said first filter, to supply to said electronic device.

15. A test device as set forth in claim 1, further comprising; a second filter having a specific difference from said first filter and converting said digital signals of said test pattern generated by said test pattern generator to analog signals; and a filter switching unit selecting either of said analog signals of said test patterns converted by said first filter and said second filter to supply to said electronic device.

16. A test device as set forth in claim 1, wherein said electronic device outputs off-set signals off-setting said test pattern supplied thereto; and said first filter adjusts said voltage level of said output analog signals based on said off-set signal.

17. A test device as set forth in claim 1, further comprising an off-set signal generator generating off-set signals defining said test patterns to be supplied to said electronic device; wherein said off-set signals generated by said off-set signal generator are input to said electronic device; and said first filter adjusts the voltage of said output analog signals absed on said off-set signals.

18. A test device as set forth in claim 1, further comprising:
  an input unit inputting said analog signals of said analog signal test pattern to be supplied to said electronic device;
  a converter converting said analog signals of said analog signal test pattern to a bit array of digital signals in accordance with a predetermined sampling clock; and
  a test pattern write control unit writing said bit array of said digital signals thereon.

19. A test device as set forth in claim 18, wherein said converter conducts digital conversion including delta-sigma modulation.

20. A test device as set forth in claim 18, wherein said sampling clock has a frequency of m/n (m>0, n>1, both m and n are integer) of that of said clock signal.

21. A method for electrically testing an electronic device having a first and second input pins, comprising:
  generating first and second test patterns using digital signals, based on data defining said first and second test patterns including an analog signal test pattern and a digital signal test pattern to be supplied to the first and second input pins of said electronic device;
  converting said digital signals of said analog signal test pattern to said analog signals by respectively filtering said digital signals using first and second pin electronic elements connected to said first and second input pins; and
  selectively outputting one of said analog signal test pattern and digital signal test pattern to said electronic device through each of said pin electronic elements.

22. A method as set forth in claim 21, further comprising displaying a chart in which both said analog signal test pattern and said digital signal test pattern are shown in accordance with a time base.

23. A method as set forth in claim 21, further comprising setting a time for supply of said analog signal test pattern and said digital signal test pattern to said electronic device.

24. A method as set forth in claim 21, wherein said converting step comprises adjusting the voltage level of said analog signals by referring to off-set values of said test patterns defined for said electronic device.

25. A testing method for electrically testing an electronic device including an analog circuit and a digital circuit comprising:
  a first step of generating a digital data based on a single timing signal, said digital data including first digital data for analog signals for testing said analog circuit and second digital data for digital signals for testing said digital circuit;
  a second step of converting said first digital data for analog signals for testing said analog circuit to analog signals by respectively filtering digital data using pin electronic elements that are connected to said analog and digital circuits; and
  a third step of selectively outputting one of said analog signals and said digital signals to said analog and digital circuits through each of said pin electronic elements.

26. A testing method defined in claim 25, wherein said first step generates said first digital data for analog signals for testing said analog circuit as a part of said digital data using delta-sigma modulation; and said second step converts said first digital data to said analog signals using band pass filtration or low pass filtration.

* * * * *